(12) United States Patent
Choi et al.

(10) Patent No.: US 9,437,664 B2
(45) Date of Patent: Sep. 6, 2016

(54) DISPLAY DEVICE AND MANUFACTURING METHOD THEREOF

(71) Applicant: Samsung Display Co., Ltd., Yongin, Gyeonggi-Do (KR)

(72) Inventors: Jung-Mi Choi, Yongin (KR); Dong-Gyu Kim, Yongin (KR); Young-In Hwang, Yongin (KR); Deok-Young Choi, Yongin (KR); Seong-Il Park, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/154,897

(22) Filed: Jan. 14, 2014

(65) Prior Publication Data

US 2014/0353671 A1 Dec. 4, 2014

(30) Foreign Application Priority Data

Jun. 3, 2013 (KR) .................. 10-2013-0063504

(51) Int. Cl.
*H01L 27/32* (2006.01)
*H01L 21/66* (2006.01)
*H01L 27/12* (2006.01)
*H01L 51/00* (2006.01)

(52) U.S. Cl.
CPC ........... *H01L 27/3276* (2013.01); *H01L 22/14* (2013.01); *H01L 27/1214* (2013.01); *H01L 51/0031* (2013.01)

(58) Field of Classification Search
CPC .................................................. H01L 27/1214
See application file for complete search history.

(56) References Cited

U.S. PATENT DOCUMENTS

2007/0194705 A1* 8/2007 Sung et al. .................... 313/506
2012/0326157 A1* 12/2012 Park et al. ....................... 257/72

FOREIGN PATENT DOCUMENTS

KR 10-2009-0105450 10/2009
KR 10-2010-0049939 5/2010

* cited by examiner

*Primary Examiner* — Thao X Le
*Assistant Examiner* — Xia L Cross
(74) *Attorney, Agent, or Firm* — Innovation Counsel LLP

(57) ABSTRACT

A display device may include a display area for displaying an image. The display device may further include a peripheral area that surrounds the display area. The display device may further include a pixel disposed in the display area. The display device may further include a bus line disposed in the peripheral area and configured to transmit a signal. The display device may further include a connection conductor set electrically connected to the bus line. The display device may further include a branch line electrically connected to the connection conductor set, configured to receive the signal from the bus line, and configured to transmit the signal to the pixel, wherein a portion of the branch line is disposed in the display area.

15 Claims, 8 Drawing Sheets

DISPLAY DEVICE AND MANUFACTURING METHOD THEREOF

RELATED APPLICATIONS

This application claims priority to and the benefit of Korean Patent Application No. 10-2013-0063504 filed in the Korean Intellectual Property Office on Jun. 3, 2013, the entire contents of which are incorporated herein by reference.

BACKGROUND

1. Field

The invention relates to a display device, such as an organic light emitting diode (OLED) display device, and a manufacturing method thereof.

2. Description of the Related Art

A device, such as an organic light emitting diode (OLED) display, may include two electrodes and an organic emission layer disposed between the two electrodes. In operation, electrons injected from one electrode and holes injected from the other electrode are combined in the organic emission layer, such that excitons are formed, and light is emitted using energy associated with the excitons.

Typically, in manufacturing a display device, a plurality of thin films and wires are formed, and an OS (open and/or short) test for confirming whether any unintended open circuit and/or any unintended short circuit exists in one or more wire sets of the wires is performed. In an OS test, one end of a wire set is connected to a shorting bar, an OS test pad is formed at the other end of the wire, a probe pin is contacted with the shorting bar and the OS test pad, and an electric signal is applied to test whether an unintended open or an unintended short exists in the wire set. If a difference between a measured resistance (obtained in the OS test) and a predetermined resistance standard is insufficient, detection of a short between the adjacent wires may be substantially difficult.

The above information disclosed in this Background section is for enhancement of understanding of the background of the invention. The Background section may contain information that does not form the prior art that is already known in this country to a person of ordinary skill in the art.

SUMMARY

Embodiments of the present invention may be related to a display device, such as an organic light emitting diode (OLED) display device. The display device may include one or more structures configured for facilitating at least one open- and/or -short (OS) test for at least one of an initialization voltage line and a global control signal line during the manufacturing of the display device. Embodiments of the invention may be related to a method for manufacturing the display device.

An embodiment of the invention may be related to a display device that may include a display area for displaying an image. The display device may further include a peripheral area that surrounds the display area. The display device may further include a pixel disposed in the display area. The display device may further include a bus line disposed in the peripheral area and configured to transmit a signal. The display device may further include a connection conductor set electrically connected to the bus line. The display device may further include a branch line electrically connected to the connection conductor set, configured to receive the signal from the bus line, and configured to transmit the signal to the pixel, wherein a portion of the branch line is disposed in the display area.

The display device may be an OLED display device.

The signal may be an initialization voltage or a control signal.

The connection conductor set may include the following elements: an interconnection conductor; a bus line connection conductor set, which may directly contact each of the interconnection conductor and the bus line; a branch line connection conductor set, which may be separated from the bus line connection conductor and may directly contact each of the interconnection conductor and the branch line. A material of the interconnection conductor may be different from a material of at least one of the bus line connection conductor set and the branch line connection conductor set.

The interconnection conductor may overlap and may directly contact each of the bus line and the branch line.

The display device may include the following elements: a substrate; a gate insulating layer disposed between the substrate and the branch line connection conductor set; and an interlayer insulating layer disposed between the branch line connection conductor set and the branch line.

The interlayer insulating layer has an opening. A portion of the interconnection conductor is disposed inside the opening and directly contacts a first portion of the branch line connection conductor set. A second portion of the branch line connection conductor set directly contacts the branch line.

A material of the second portion of the branch line connection conductor set may be different from a material of the first portion of the branch line connection conductor set.

The interlayer insulating layer may have a contact hole. The branch line may be connected to the branch line connection conductor set through the contact hole.

The display device may include a storage capacitor that includes a first storage electrode and a second storage electrode. The second storage electrode may be disposed between the gate insulating layer and the interlayer insulating layer. A material of at least one of the bus line connection conductor set and the branch line connection conductor set may be same as a material of the second storage electrode.

The display device may include the following elements: a transistor that includes a gate electrode, a source electrode, and a drain electrode; and a pixel electrode disposed in the display area and electrically connected to one of the source electrode and the drain electrode. A material of the pixel electrode may be same as the material of the interconnection conductor.

A material of at least one of the bus line and the branch line may be same as a material of at least one of the source electrode and the drain electrode.

A material of the bus line may be same as a material of the gate electrode.

A first material of at least one of the bus line connection conductor set and the branch line connection conductor set may be same as a material of the gate electrode.

The display device may include a storage capacitor that includes a storage electrode. A second material of the at least one of the bus line connection conductor set and the branch line connection conductor set may be same as a material of the storage electrode.

The bus line connection conductor set may include a first bus line connection conductor. The branch line connection conductor set may include a first branch line connection conductor. The first bus line connection conductor may directly contact the interconnection conductor. The first branch line connection conductor may be separated from the first bus line connection conductor, may directly contact the interconnection conductor, and may be electrically connected to the first bus line connection conductor through the interconnection conductor.

The bus line connection conductor set may further include a second bus line connection conductor. The branch line connection conductor set may further include a second branch line connection conductor. The second bus line connection conductor may overlap and directly contact each of the bus line and the first bus line connection conductor. An edge of the second bus line connection conductor may directly contacts the interconnection conductor. The second branch line connection conductor may overlap and directly contact each of the branch line and the first branch line connection conductor. An edge of the second branch line connection conductor may directly contacts the interconnection conductor.

The display device may include the following elements: a substrate; a gate insulating layer disposed between the substrate and the second bus line connection conductor; and an interlayer insulating layer disposed between the second bus line connection conductor and the bus line and having a contact hole. The bus line may contact the second bus line connection conductor through the contact hole.

The first bus line connection conductor may overlap and directly contact the bus line. The first branch line connection conductor may overlap and directly contact the branch line.

An embodiment of the invention may be related to method for manufacturing a display device. The method may include the following steps: forming a bus line in a peripheral area that surrounds a display area; forming a branch line that is separated from the bus line, a portion of the branch line being formed in the display area; performing a test on the branch line for determining at least one of existence of an unintended open and existence of an unintended short associated with the branch line; and after the performing the test, forming an interconnection conductor for electrically connecting the bus line to the branch line.

The interconnection conductor may overlap and directly contact each of the bus line and the branch line.

The method may include the following steps: forming a bus line connection conductor set before the forming the bus line, wherein each of the interconnection conductor and the bus line may be formed to direct contact the bus line connection conductor set; and forming a branch line connection conductor set before the forming the branch line, wherein the branch line connection conductor set may be separated from the bus line connection conductor set, and wherein each of the interconnection conductor and the branch line may be formed to direct contact the branch line connection conductor set.

The method may include the following steps: forming a substrate; forming a gate insulating layer on the substrate; forming the branch line connection conductor set on the gate insulating layer such that the gate insulating layer is disposed between the substrate and the branch line connection conductor set; forming an interlayer insulating layer on the branch line connection conductor set; and forming the branch line on the interlayer insulating layer such that the interlayer insulating layer is disposed between the branch line connection conductor set and the branch line.

The method may include the following steps: forming an opening in the interlayer insulating layer; disposing a portion of the interconnection conductor inside the opening to directly contact a first portion of the branch line connection conductor set, and disposing a portion of the branch line to directly contact a second portion of the branch line connection conductor set.

A material of the second portion of the branch line connection conductor set may be different from a material of the first portion of the branch line connection conductor set.

The method may include the following steps: forming a contact hole in the interlayer insulating layer; and disposing the portion of the branch line inside the contact hole.

The method may include forming a storage capacitor that includes a first storage electrode and a second storage electrode. The second storage electrode may be disposed between the gate insulating layer and the interlayer insulating layer. A material of at least one of the bus line connection conductor set and the branch line connection conductor set may be same as a material of the second storage electrode.

The method may include the following steps: forming a transistor that includes a gate electrode, a source electrode, and a drain electrode; and forming a pixel electrode in the display area such that the pixel electrode is electrically connected to one of the source electrode and the drain electrode. A material of the pixel electrode may be same as the material of the interconnection conductor.

A material of at least one of the bus line and the branch line may be same as a material of at least one of the source electrode and the drain electrode.

A material of the bus line may be same as a material of the gate electrode.

A first material of at least one of the bus line connection conductor set and the branch line connection conductor set may be same as a material of the gate electrode.

The method may include forming a storage capacitor that includes a storage electrode. A second material of the at least one of the bus line connection conductor set and the branch line connection conductor set may be same as a material of the storage electrode.

The bus line connection conductor set may include a first bus line connection conductor. The branch line connection conductor set may include a first branch line connection conductor. The first bus line connection conductor may directly contact the interconnection conductor. The first branch line connection conductor may be separated from the first bus line connection conductor, may directly contact the interconnection conductor, and may be electrically connected to the first bus line connection conductor through the interconnection conductor.

The bus line connection conductor set may further include a second bus line connection conductor. The branch line connection conductor set may further include a second branch line connection conductor. The second bus line connection conductor may overlap and directly contact each of the bus line and the first bus line connection conductor. The second branch line connection conductor may overlap and directly contact each of the branch line and the first branch line connection conductor.

The method may include the following steps: forming an interlayer insulating layer on second bus line connection conductor; forming a contact hole in the interlayer insulating layer; forming the bus line on the interlayer insulating layer such that the interlayer insulating layer is disposed between the second bus line connection conductor and the bus line and such that the bus line contacts the second bus line connection conductor through the contact hole.

The first bus line connection conductor may overlap and directly contacts the bus line. The first branch line connection conductor may overlap and directly contacts the branch line.

An embodiment of the invention may be related to a device, such as an organic light emitting diode (OLED) display device, that may include the following elements: a substrate; a display area formed on the substrate for displaying an image; a peripheral area surrounding the display area, wherein the peripheral area includes a bus line, which may surround the display area; a branch line separated from the bus line; and a connection member configured to electrically connect the bus line to the branch line.

The connection member may include a main connection member and an assistance connection member. The assistance connection member may include a first connection member formed on the substrate and including a first bus line connection member and a first branch line connection member that are separated from each other, and a second connection member including a second bus line connection member and a second branch line connection member respectively formed on the first bus line connection member and the first branch line connection member and respectively connected to the bus line and the branch line. The main connection member may be formed on the first bus line connection member and the first branch line connection member. The main connection member may electrically connect the first bus line connection member and the first branch line connection member to each other.

The main connection member may extend onto the bus line and the branch line thereby connecting the bus line and the branch line to each other.

The display device may include the following elements: a gate insulating layer formed between the substrate and the first connection member; and an interlayer insulating layer formed between the second connection member and the bus line and branch line.

The interlayer insulating layer may have an opening that exposes a first end of the first connection member.

A second end of the first connection member may contact the second connection member. The first end of the first connection member, which is exposed through the opening of the interlayer insulating layer, may contact the main connection member.

The bus line may be connected to the second bus line connection member through a bus contact hole formed at the interlayer insulating layer, and the branch line may be connected to the second branch line connection member through a branch contact hole formed at the interlayer insulating layer.

The bus line and the branch line may form an initialization voltage line for transmitting at least an initialization voltage to a plurality of pixels of the display area.

The display area may include: a semiconductor layer and a first storage electrode formed on the substrate; a gate electrode, a second storage electrode, and a pixel electrode formed on the gate insulating layer covering the semiconductor layer and the first storage electrode; a source electrode and a drain electrode connected to the semiconductor layer and formed on the interlayer insulating layer covering the gate electrode and the second storage electrode; and a pixel definition layer covering the source electrode and the drain electrode, wherein the pixel electrode may be exposed through a pixel opening formed at the interlayer insulating layer and the pixel definition layer.

The main connection member may be formed with or formed of the same material as the pixel electrode.

The bus line and a portion of the branch line of the initialization voltage line may be formed at an upper portion of the peripheral area and may be formed of and/or formed with the same material and/or layer as the source electrode and the drain electrode.

The second connection member of the initialization voltage line may be formed at the upper portion of the peripheral area and may be formed of and/or formed with the same material and/or layer as the gate electrode.

The connection member may include the following elements: an assistance connection member formed on the substrate and including a first bus line connection member and a first branch line connection member that are separated from each other; and a main connection member formed on the first bus line connection member and the first branch line connection member and connecting the first bus line connection member and the first branch line connection member to each other.

The bus line may be formed on the first bus line connection member, and the branch line may be formed on the first branch line connection member.

The display device may include the following elements: a gate insulating layer formed between the substrate and the first connection member; and an interlayer insulating layer formed between the first connection member and the branch line.

The bus line may extend onto the first bus line connection member to directly contact it, and the branch line may be connected to the first connection member through a branch contact hole formed at the interlayer insulating layer.

The interlayer insulating layer may have an opening that exposes at least an end portion of the first connection member.

The main connection member may contact and electrically connect end portions of the first bus line connection member and the first branch line connection member that are exposed through the opening.

The bus line and the branch line may form a global control signal line for transmitting a global control signal to a plurality of pixels of the display area.

The display area may include: a semiconductor layer and a first storage electrode formed on the substrate; a gate electrode, a second storage electrode, and a pixel electrode formed on the gate insulating layer covering the semiconductor layer and the first storage electrode; a source electrode and a drain electrode connected to the semiconductor layer and formed on the interlayer insulating layer covering the gate electrode and the second storage electrode; and a pixel definition layer covering the source electrode and the drain electrode, wherein the pixel electrode may be exposed through a pixel opening formed at the interlayer insulating layer and the pixel definition layer.

The main connection member may be formed of or formed with the same material as the pixel electrode.

The bus line of the global control signal line may be formed at the lower portion of the peripheral area and may be formed of and/or formed with the same material and/or layer as the gate electrode. A portion of the branch line of the global control signal line may be formed at the lower portion of the peripheral area and may be formed of and/or formed with the same material and/or layer as the source electrode and the drain electrode.

An embodiment of the invention may be related to a method for manufacturing a display device, such as an organic light emitting diode (OLED) display device. The display device may include a substrate that has a display area for displaying an image and has a peripheral area surrounding the display area. The method may include the following steps: forming a bus line surrounding in the peripheral area;

forming a branch line that is separated from the bus line, a portion of the branch line being disposed in the display area; performing an open- and/or -short (OS) test on the branch line; and, after the performing the OS test, forming a main connection member for electrically connecting the bus line and the branch line.

The method may include, before forming the bus line and the branch line, forming an assistance connection member on the substrate. The step of forming the assistance connection member may include the following steps: forming a first connection member including a first bus line connection member and a first branch line connection member that are separated from each other on the substrate, and forming a second connection member including a second bus line connection member and a second branch line connection member respectively connected to the bus line and the branch line on the first bus line connection member and the first branch line connection member.

The main connection member may be formed on the first bus line connection member and the first branch line connection member to connect the first bus line connection member and the first branch line connection member to each other.

The forming the semiconductor layer and the first storage electrode at the display area may include the following steps: forming a gate insulating layer covering the semiconductor layer and the first storage electrode; forming a second storage electrode and a gate electrode on the gate insulating layer; forming an interlayer insulating layer covering the second storage electrode and the gate electrode; forming a source electrode and a drain electrode on the interlayer insulating layer and a pixel opening exposing the gate insulating layer; forming a pixel electrode at the pixel opening; and forming a pixel definition layer covering the source electrode and the drain electrode, wherein the main connection member may be simultaneously formed of or formed with the same material as the pixel electrode.

The bus line and the branch line may form an initialization voltage line for transmitting an initialization voltage to a plurality of pixels of the display area.

The bus line and a portion of the branch line of the initialization voltage line may be formed at an upper portion of the peripheral area and may be formed of and/or formed with the same material and/or layer as the source electrode and the drain electrode.

The second connection member of the initialization voltage line may be formed at the upper portion of the peripheral area and may be formed of and/or formed with the same material and/or layer as the gate electrode.

The method may include, before forming the bus line and the branch line, forming an assistance connection member including a first bus line connection member and a first branch line connection member that are separated from each other on the substrate.

The main connection member may be formed on the first bus line connection member and the first branch line connection member to electrically connect the first bus line connection member and the first branch line connection member to each other.

The method may include the following steps: forming a semiconductor layer and a first storage electrode at the display area, forming a gate insulating layer covering the semiconductor layer and the first storage electrode, forming a second storage electrode and a gate electrode on the gate insulating layer, forming an interlayer insulating layer covering the second storage electrode and the gate electrode, forming a source electrode and a drain electrode on the interlayer insulating layer and forming a pixel opening exposing the gate insulating layer, forming a pixel electrode at the pixel opening, and forming a pixel definition layer covering the source electrode and the drain electrode. The main connection member may be simultaneously formed of or formed with the same material as the pixel electrode.

The bus line and the branch line may form a global control signal line for transmitting a global control signal to a plurality of pixels of the display area.

A portion of the branch line of the global control signal line may be formed at the lower portion of the peripheral area and may be formed of and/or formed with the same material and/or layer as the source electrode and the drain electrode.

The bus line of the global control signal line may be formed at the lower portion of the peripheral area and may be formed of and/or formed with the same material and/or layer as the gate electrode.

According to embodiment of the invention, the bus line and the branch line of an initialization voltage line are substantially separated from each other before and during an OS test, such that the resistance of the bus line may not substantially affect the measured resistance. Therefore, a difference between the measured resistance and a predetermined resistance standard may be easily detected if an unintended short or an unintended open exists. Advantageously, the accuracy and/or efficiency of the OS test may be maximized.

According to embodiment of the invention, the bus line and the branch line of the global control signal line are substantially separated from each other before and during an OS test, such that the resistance of the bus line may not substantially affect the measured resistance. Therefore, a difference between the measured resistance and a predetermined resistance standard may be easily detected if an unintended short or an unintended open exists. Advantageously, the accuracy and/or efficiency of the OS test may be maximized.

DETAILED DESCRIPTION

Figure 1:
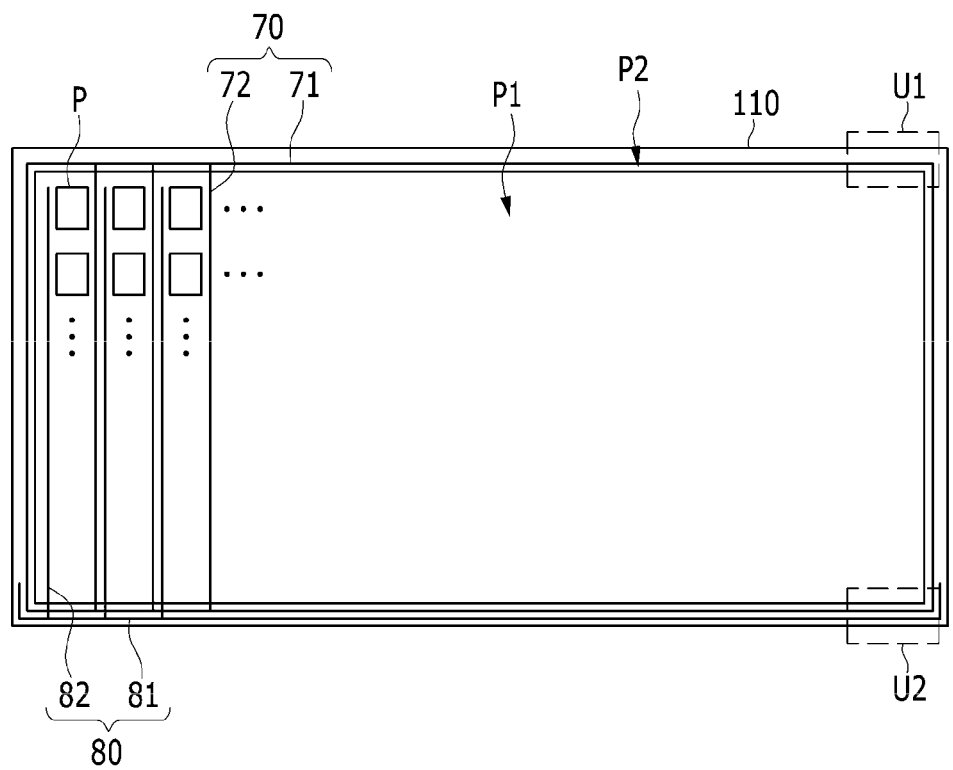
FIG. 1 is a plan view (e.g., a top view) of an organic light emitting diode (OLED) display according to an embodiment of the present invention.

Embodiments of the invention are described with reference to the accompanying drawings. As those skilled in the art would realize, the described embodiments may be modified in various different ways, all without departing from the spirit or scope of the invention.

For clarity and conciseness of the description, parts may be omitted from the drawings, and same reference characters or numerals may indicate identical parts or analogous parts.

In the drawings, thicknesses of layers, films, panels, regions, etc., may be exaggerated for clarity and may not limit embodiments of the invention.

If an element such as a layer, film, region, or substrate is referred to as being "on" another element, it can be directly on the other element, or an intervening element may be present.

Although the terms first, second, etc. may be used herein to describe various signals, elements, components, regions, layers, and/or sections, these signals, elements, components, regions, layers, and/or sections should not be limited by these terms. These terms may be used to distinguish one signal, element, component, region, layer, or section from another signal, region, layer, or section. Thus, a first signal, element, component, region, layer, or section discussed below may be termed a second signal, element, component, region, layer, or section without departing from the teachings of the present invention. The description of an element as a "first" element may not require or imply the presence of a second element or other elements. The terms first, second, etc. may also be used herein to differentiate different categories of elements. For conciseness, the terms first, second, etc. may represent first-type (or first-category), second-type (or second-category), etc., respectively. The term "connect" may mean "electrically connect"; the term "insulate" may mean "electrically insulate"; the term "conductor" may mean "electrical conductor".

FIG. 1 is a plan view (e.g., a top view) of a device, such as an organic light emitting diode (OLED) display device (or OLED display), according to an embodiment of the invention.

As shown in FIG. 1, the display device, e.g., an organic light emitting diode (OLED) display, includes a substrate 110, a display area P1 formed on the substrate 110 for displaying an image, and a peripheral area P2 enclosing the display area P1.

The OLED display includes a plurality of pixels P, an initialization voltage line 70 for transmitting an initialization voltage to the plurality of pixels P, and a global control signal line 80 for transmitting a global control signal to the plurality of pixels P. The plurality of pixels P may be disposed in the display area P1. The initialization voltage line 70 may include a bus line 71 and a plurality of branch lines 72. The bus line 71 may be disposed in the peripheral area P2 and may substantially surround the display area P1. The plurality of branch lines 72 may be electrically connected to the bus line 71 and the plurality of pixels P. The global control signal line 80 may include a bus line 81 and a plurality of branch lines 82. The bus line 81 may be disposed in the peripheral area P2. The plurality of branch lines 82 may be electrically connected to the bus line 81 and the plurality of pixels P.

Figure 2:
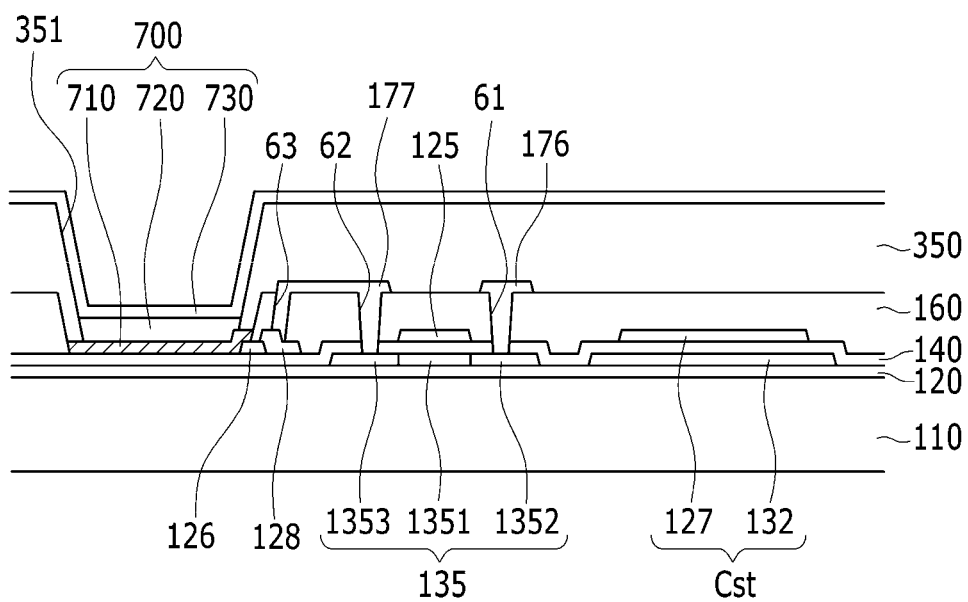
FIG. 2 is a cross-sectional view of a display area of a display device, such as an organic light emitting diode (OLED) display device, according to an embodiment.
Figure 3:
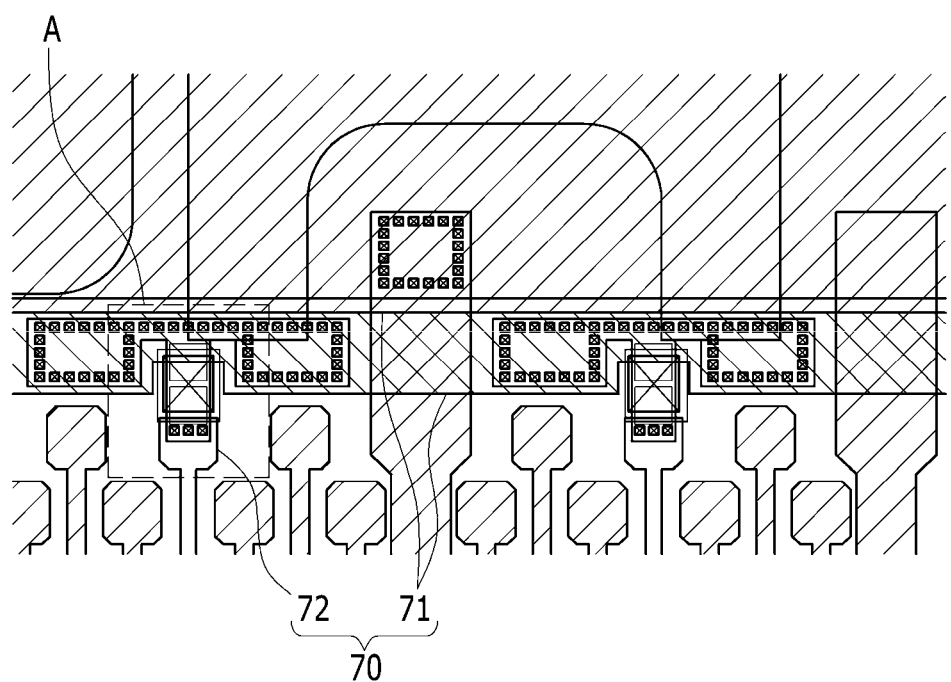
FIG. 3 is a layout view of a portion of an initialization voltage line formed at a first portion (e.g., an upper portion (U1 of FIG. 1)) of a peripheral area of an organic light emitting diode (OLED) display according to an embodiment.
Figure 4:
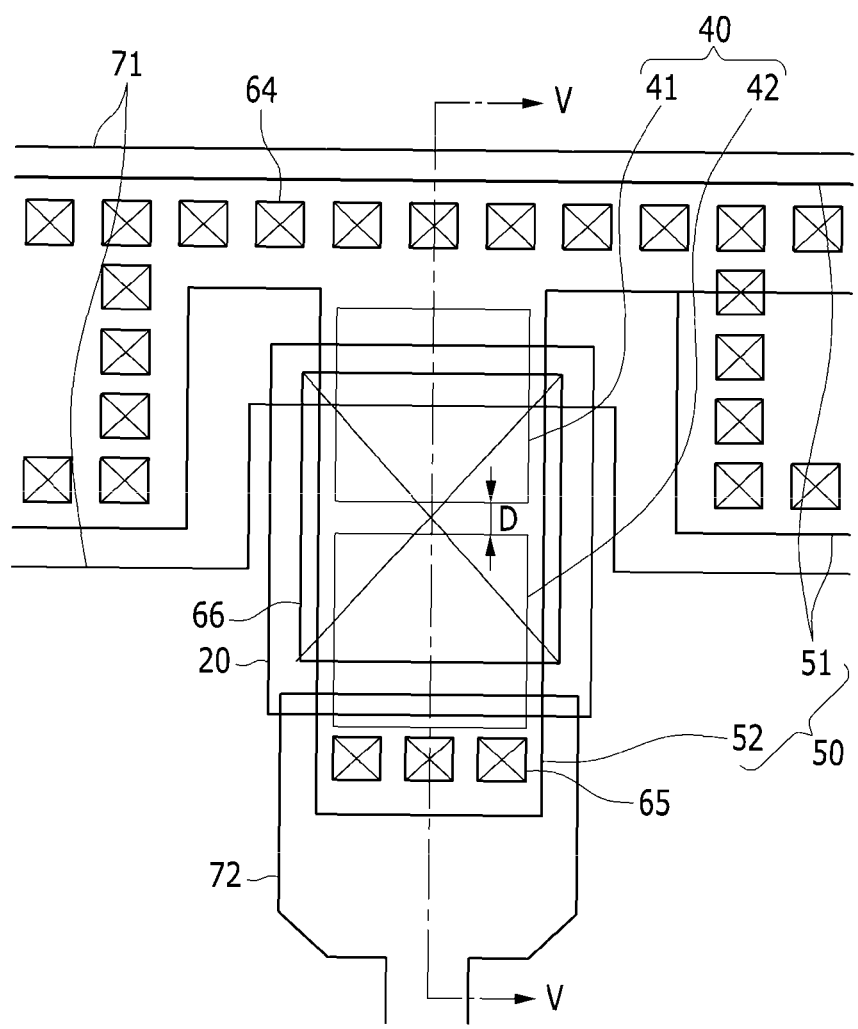
FIG. 4 is an enlarged layout view of a portion A indicated in FIG. 3.
Figure 5:
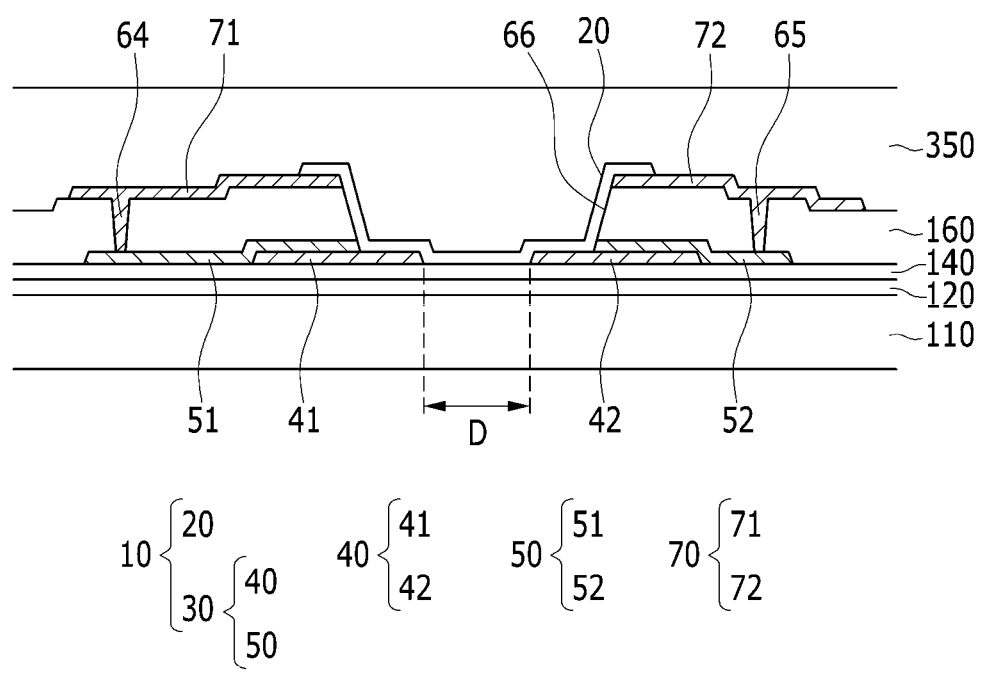
FIG. 5 is a cross-sectional view taken along the line V-V indicated in FIG. 4.

FIG. 2 is a cross-sectional view of the display area P1 of the organic light emitting diode (OLED) display illustrated in FIG. 1. FIG. 3 is a layout view of a portion of the initialization voltage line 70 formed at a first portion (e.g., an upper portion) of the peripheral area P2 of the organic light emitting diode (OLED) display. FIG. 4 is an enlarged layout view of a portion A indicated in FIG. 3. FIG. 5 is a cross-sectional view taken along the line V-V indicated in FIG. 4.

As shown in FIG. 2, at the display area P1 of the organic light emitting diode (OLED) display, a buffer layer 120 is formed on the substrate 110. The substrate 110 may be an insulating substrate formed of glass, quartz, ceramic, or plastic, or the substrate 110 may be a metallic substrate formed of stainless steel. The buffer layer 120 may have a single-layered structure of silicon nitride (SiNx), or the buffer layer 120 may have a double-layered structure of silicon nitride (SiNx) and silicon oxide (SiO2). The buffer layer 120 may be configured for preventing unwanted substances, such as moisture of other environmental substances, from intruding into components of the OLED display and/or may providing a flat surface on which components of the OLED display may be formed.

A semiconductor layer 135 and a first storage electrode 132 are formed at separated positions on the buffer layer 120. The semiconductor layer 135 and the first storage electrode 132 may be made of polysilicon or an oxide semiconductor. The oxide semiconductor may contain one or more oxides of one or more of titanium (Ti), hafnium (Hf), zirconium (Zr), aluminum (Al), tantalum (Ta), germanium (Ge), zinc (Zn), gallium (Ga), tin (Sn), and indium (In). Alternatively or additionally, the oxide semiconductor may contain one or more complex oxides, such as one or more of zinc oxide (ZnO), indium-gallium-zinc oxide (In-GaZnO4), zinc-indium oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O). In an embodiment, the semiconductor layer 135 and the first storage electrode 132 are made of an oxide semiconductor, and the OLED display may include a protective layer that is configured to protect the semiconductor layer 135 and the first storage electrode 132 from external environmental factors, such as a high temperature.

The semiconductor layer 135 includes a channel region 1351 that is not doped with impurities. The semiconductor layer 135 further includes a source region 1352 and a drain region 1353 that are doped with impurities and are formed at two sides of the channel region 1351. The impurities may vary according to the type of the thin film transistor that includes the semiconductor layer 135 and may be N-type impurities or P-type impurities.

A gate insulating film 140 is formed on the semiconductor layer 135 and the first storage electrode 132. The gate insulating layer 140 may be a single layer or may include a plurality of layers containing at least one of silicon nitride and silicon oxide.

A second storage electrode 127, a first pixel connection member 126, and a gate electrode 125, a second pixel connection member 128, and a pixel electrode 710 are formed on the gate insulating layer 140. The second pixel connection member 128 contacts one end of the first pixel connection member 126, and the pixel electrode 710 contacts the other end of the first pixel connection member 126. The gate electrode 125 overlaps the semiconductor layer 135. The second storage electrode 127 overlaps the first storage electrode 132, thereby forming a storage capacitor Cst that includes a portion of the gate insulating layer 140 as a dielectric layer.

An interlayer insulating layer 160 is formed on the gate electrode 125 and the second storage electrode 127. The interlayer insulating layer 160 may be formed of silicon nitride or silicon oxide, analogous to the gate insulating layer 140.

The interlayer insulating layer 160 and the gate insulating layer 140 have a source contact hole 61 and a drain contact hole 62 that respectively expose the source region 1352 and the drain region 1353. The interlayer insulating layer 160 has a pixel contact hole 63 that exposes the second pixel connection member 128.

A source electrode 176 and a drain electrode 177 are formed on the interlayer insulating layer 160. The source electrode 176 and the drain electrode 177 are connected to the source region 1352 and the drain region 1353 through the source contact hole 61 and the drain contact hole 62, respectively.

A pixel definition layer 350 is formed on the source electrode 176 and the drain electrode 177. The pixel definition layer 350 has a pixel opening 351 that exposes the pixel electrode 710. The pixel definition layer 350 may be formed of a resin such as one or more of polyacrylates, polyimides, and the like. Alternatively or additionally, the pixel definition layer 350 may be formed of one or more of silica-based inorganic matters and the like.

The pixel electrode 710 is electrically connected to the drain electrode 177 through the connection members 126 and 128 and through the pixel contact hole 63 formed at the interlayer insulating layer 160. The pixel electrode 710 may be an anode of an organic light emitting diode (OLED) 700.

Two portions of the pixel definition layer 350 may overlap edge portions of the interlayer insulating layer 160 and the pixel electrode 710. The pixel opening 351, which exposes the pixel electrode 710, may be positioned between the two portions of the pixel definition layer 350.

An organic emission layer 720 is formed at the pixel opening 351 of the pixel definition layer 350. The organic emission layer 720 includes one or more of an emission layer, a hole injection layer (HIL), a hole transport layer (HTL), an electron transport layer (ETL), and an electron injection layer (EIL). In an embodiment, the organic emission layer 720 may include all of the five layers, the hole injection layer (HIL) may be placed on the pixel electrode 710 (which may be an anode), and the hole transport layer (HTL), the emission layer, the electron transport layer (ETL), and the electron injection layer (EIL) may be sequentially stacked over the hole injection layer (HIL).

A common electrode 730 is formed on the pixel definition layer 350 and the organic emission layer 720. The common electrode 730 may be a reflective layer or a semi-transmissive layer and may include a reflective material. The reflective material constituting the reflective layer or semi-transmissive layer may include at least one metal or alloy that includes one or more of Mg, Ag, Au, Ca, Li, Cr, and Al. The common electrode 730 may serve as a cathode of the organic light emitting diode (OLED) 700, which may include the pixel electrode 710, the organic emission layer 720, and the common electrode.

As illustrated in FIG. 3 to FIG. 5, the bus line 71 of the initialization voltage line 70 and a branch line 72 of the initialization voltage line 70 are electrically connected by a connection member set 10.

The connection member set 10 includes a main connection member 20 and an assistance connection member set 30 that are electrically connected to each other. The assistance connection member set 30 includes a first connection member set 40 and a second connection member set 50 that are electrically connected to each other. The first connection member set 40 includes a first bus line connection member 41 and a first branch line connection member 42 separated from each other. The second connection member set 50 includes a second bus line connection member 51 and a second branch line connection member 52 that directly contact and are electrically connected to the first bus line connection member 41 and the first branch line connection member 42, respectively. The second bus line connection member 51 and the second branch line connection member 52 are electrically connected to the bus line 71 and the branch line 72 through a bus contact hole 64 (in which a portion of the bus line 71 is disposed) and a branch contact hole 65 (in which a portion of the branch line 72 is disposed). The main connection member 20 directly contacts the first bus line connection member 41 and the first branch line connection member 42 such that the first bus line connection member 41 and the first branch line connection member 42 are electrically connected to each other through at least the main connection member 20. The main connection member 20 directly contacts the bus line 71 and the branch line 72 such that the bus line 71 and the branch line 72 are electrically connected to each other through at least the main connection member 20. Accordingly, the bus line 71 and the branch line 72 are electrically connected to each other through both the main connection member 20 and the assistance connection member set 30.

Referring to FIG. 5, the buffer layer 120 and the gate insulating layer 140 are sequentially formed on the substrate 110 at the peripheral area P2 of the organic light emitting diode (OLED) display. The first bus line connection member 41 and the first branch line connection member 42 that are separated by a gap with a width D are formed on the gate insulating layer 140. The second bus line connection member 51 and the second branch line connection member 52 are respectively formed on the first bus line connection member 41 and the first branch line connection member 42. First portions (e.g., outer ends) of the first bus line connection member 41 and the first branch line connection member 42 overlap and directly contact first portions (e.g., inner ends) the second bus line connection member 51 and the second branch line connection member 52, respectively. Second portions (e.g., inner ends) of the first bus line connection member 41 and the first branch line connection member 42 overlap and directly contact the main connection member 20. Second portions (e.g., outer ends) the second bus line connection member 51 and the second branch line connection member 52 may directly contact the portion of the bus line 71 disposed in the bus contact hole 64 and the portion of the branch line 72 disposed in the branch contact hole 65, respectively. The second connection member set 50 of the initialization voltage line 70 formed at the upper portion of the peripheral area P2 may be formed with or formed of the same material as the gate electrode 125.

The interlayer insulating layer 160 is formed on the second bus line connection member 51 and the second branch line connection member 52. The interlayer insulating layer 160 has an opening 66 that exposes an end of the first bus line connection member 41 and an end of the first branch line connection member 42, which are separated from each other by the gap with the width D.

The bus line 71 and the branch line 72 are formed on the interlayer insulating layer 160. The bus line 71 is connected to the second bus line connection member 51 through the bus contact hole 64 formed at the interlayer insulating layer 160. The branch line 72 is connected to the second branch line connection member 52 through the branch contact hole 65 formed at the interlayer insulating layer 160. The bus line 71 and the branch line 72 of the initialization voltage line 70 formed at the upper portion of the peripheral area P2 are formed with or formed of the same material as the source electrode 176 and the drain electrode 177.

The main connection member 20 may overlap and directly contact one end of each of the first bus line connection member 41 and the first branch line connection member 42 exposed through the opening 66 of the interlayer insulating layer 160. The gap with the width D may be narrower than the opening 66 and may be positioned inside the opening 66. A portion of the main connection member 20 that is disposed inside the gap may directly contact an edge of each of the connection members 41 and 42. The main connection member 20 extends onto the bus line 71 and the branch line 72, thereby electrically connecting the bus line 71 and the branch line 72 to each other. The main connection member 20 may be formed with or formed of the same material as the pixel electrode 710. A portion of the bus line 71 and a portion of the second bus line connection member 51 may be disposed between a portion of the main connection member 20 and a portion of the first bus line connection member 41. A portion of the branch line 72 and a portion of the second branch line connection member 52 may be disposed between a portion of the main connection member 20 and a portion of the first branch line connection member 42.

Figure 6:
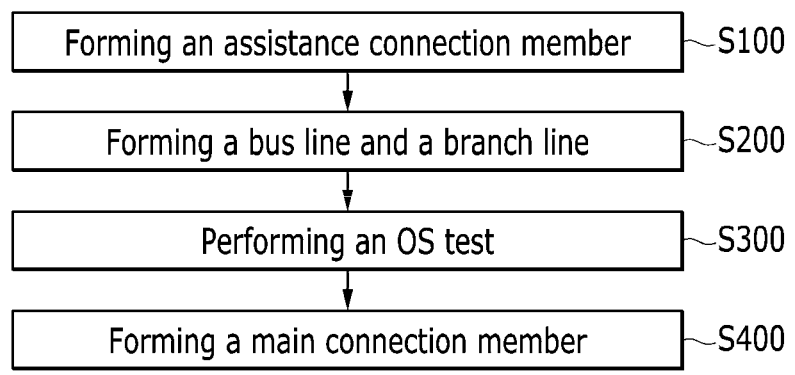
FIG. 6 is a flowchart of a method for manufacturing an organic light emitting diode (OLED) display according to an embodiment.

FIG. 6 is a flowchart of a method for manufacturing an organic light emitting diode (OLED) display according to an embodiment.

As shown in FIG. 6, in step S100, the assistance connection member set 30 is formed at the peripheral area P2.

In step S100, the first connection member set 40, which includes the first bus line connection member 41 and the first branch line connection member 42, is formed on the gate insulting layer 140, which overlaps the buffer layer 120 and/or the substrate 110. Subsequently or substantially simultaneously, the second bus line connection member 51 and the second branch line connection member 52 of the second connection member set 50 are respectively formed on the first bus line connection member 41 and the first branch line connection member 42. The first connection member set 40 is formed with or formed of the same material and/or formed at the same layer as the second storage electrode 127. The second connection member set 50 is formed with or formed of the same material and/or formed at the same layer as the gate electrode 125. The interlayer insulating layer 160 is formed on the assistance connection member set 30.

In step S200, the bus line 71 and a plurality of branch lines, which includes the branch line 72 and is separated from the bus line 71) are formed on the interlayer insulating layer 160. The bus line 71 and the branch line 72 are formed with or formed of the same material and/or formed at the same layer as the source electrode 176 and the drain electrode 177.

In step S300, an OS test is performed on the branch line 72. A probe pin is contacted with both ends of the branch line 72 (i.e., the tested branch line 72) to test whether any unintended short exists between the tested branch line 72 and an adjacent branch line 72 that immediately neighbors the tested branch line 72. The branch line 72 is separated from the bus line 71 by at least the gap with the width D, such that the resistance of the bus line 71 may not substantially affect the measured resistance. Therefore, a difference between the measured resistance and a predetermined resistance standard may be easily detected if an unintended short exists between the adjacent branch lines 72. Advantageously, the accuracy and/or efficiency of the OS test may be maximized.

In step S400, the main connection member 20 for connecting the bus line 71 and the branch line 72 to each other is formed. The main connection member 20 is formed on the first bus line connection member 41 and the first branch line connection member 42 such that the first bus line connection member 41 and the first branch line connection member 42, which are separated by the gap with the width D, are electrically connected to each other. The main connection member 20 is simultaneously formed with the same material as the pixel electrode 710.

As described above, before the OS test is performed, the bus line 71 and the branch line 72 of the initialization voltage line 70 are separated and electrically insulated from each other. After the OS test has been performed, the bus line 71 and the branch line 72 of the initialization voltage line are electrically connected by the main connection member 20. Advantageously, in the OS test, the difference between the measured resistance and the resistance standard may be easily detected if an unintended short exists between the adjacent branch lines.

In an embodiment, a connection member may be formed between a bus line and a branch line of an initialization voltage line at an upper portion of a peripheral area of an organic light emitting diode (OLED) display. In an embodiment, a connection member may be formed between a bus line and a branch line of at least one of an initialization voltage line and a global control signal line at a lower portion of a peripheral area of an organic light emitting diode (OLED) display.

Figure 7:
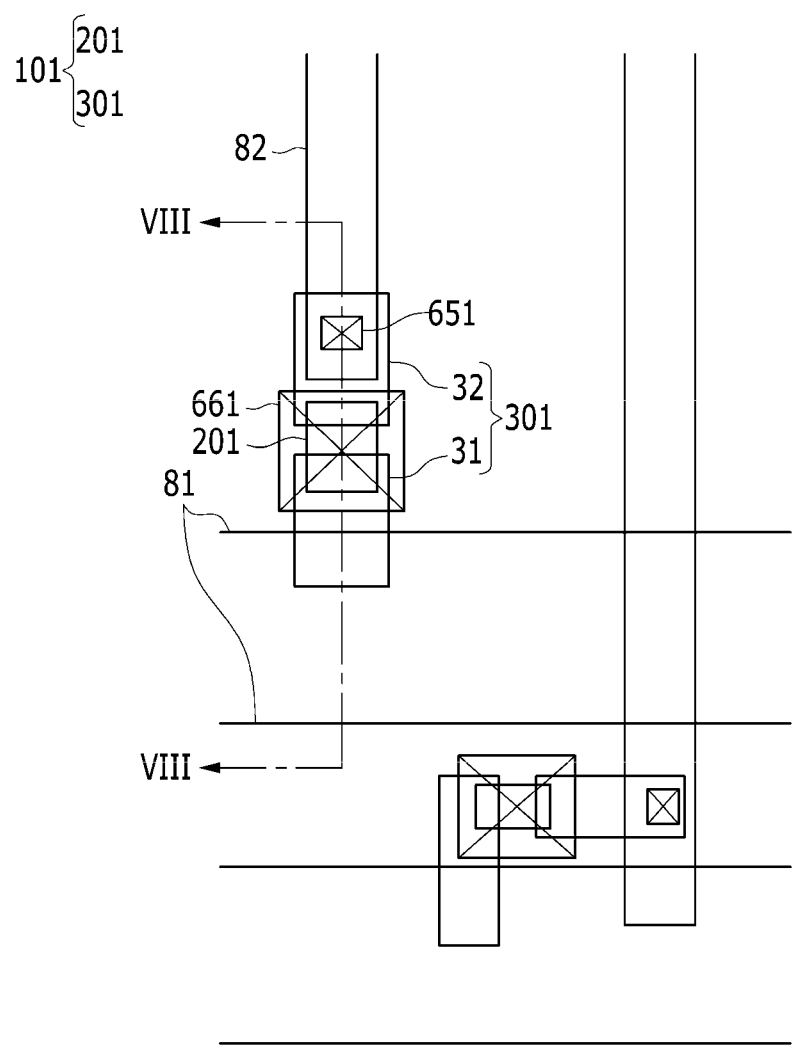
FIG. 7 is an enlarged layout view of a portion of a global control signal line formed at a second portion (e.g., a lower portion) of a peripheral area of an organic light emitting diode (OLED) display according to an embodiment.
Figure 8:
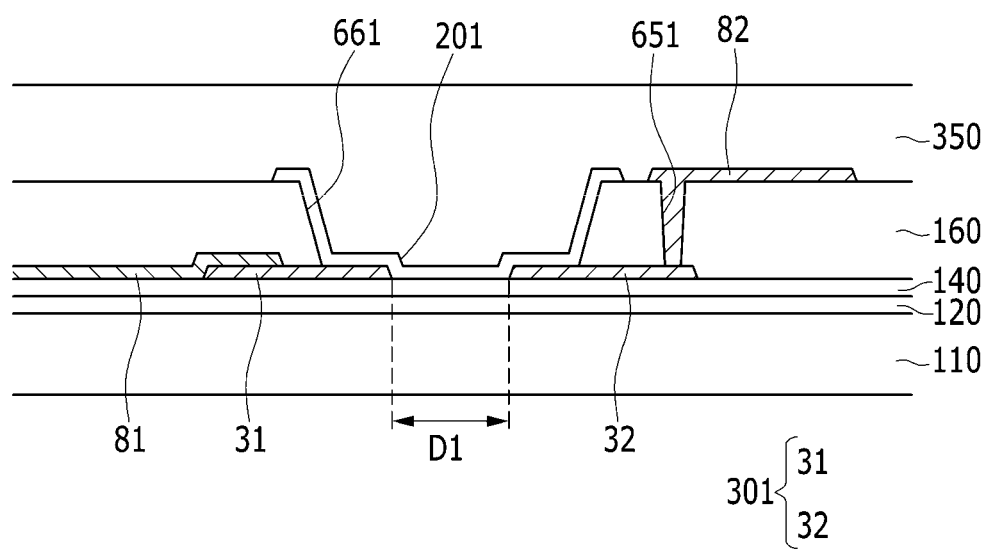
FIG. 8 is a cross-sectional view taken along the line VIII-VIII indicated in FIG. 7.

FIG. 7 is an enlarged layout view of a portion of a global control signal line formed at a second portion (e.g., a lower portion (U2 of FIG. 1)) of a peripheral area of an organic light emitting diode (OLED) display according to an embodiment. FIG. 8 is a cross-sectional view taken along the line VIII-VIII indicated in FIG. 7.

The OLED display(s) and associated method(s) discussed with reference to FIGS. 7 and 8 may include elements, steps, features, and/or advantages that are identical to and/or analogous to elements, steps, features, and/or advantages of the OLED display(s) and associated method(s) discussed with reference to FIG. 1 to FIG. 5.

Referring to FIG. 7 and FIG. 8, at the lower portion of the peripheral area P2 of the organic light emitting diode (OLED) display, the bus line 81 of the global control signal line 80 (which may be configured for transmitting global control signals such as GI, GW, and GE to a plurality of pixels P) may be separated from the branch line 82 and may be electrically connected to the branch line 82 through a connection member set 101.

The connection member set 10 includes a main connection member 201 and an assistance connection member set 301 that are electrically connected to each other.

The assistance connection member set 301 includes a first bus line connection member 31 and a first branch line connection member 32 that are separated from each other.

The main connection member 20 directly contacts the first bus line connection member 31 and the first branch line connection member 32 thereby electrically connecting the first bus line connection member 31 and the first branch line connection member 32 to each other.

The bus line 81 extends onto the first bus line connection member 31 to directly contact the first bus line connection member 31. A branch line 82 is electrically connected to the second branch line connection member 32 through a branch contact hole 651. A portion of the branch line 82 is disposed through the branch contact hole 651 and directly contacts the second branch line connection member 32.

Accordingly, the bus line 81 and the branch line 82 are electrically connected to each other through both the main connection member 201 and the assistance connection member set 301.

Referring to FIG. 8, the buffer layer 120 and the gate insulating layer 140 are sequentially formed on the substrate 110 at the peripheral area P2 of the organic light emitting diode (OLED) display. The first bus line connection member 31 and the first branch line connection member 32 that are separated from each other by a gap with a width D1 are formed on the gate insulating layer 140. The bus line 81 directly contacts both the gate insulating layer 140 and the first bus line connection member 31. The bus line 81 of the global control signal line 80 formed at the lower portion of the peripheral area P2 may be formed of and/or formed with the same material and/or same layer as the gate electrode 125. The width D1 may be equal to or different from the width D discussed with reference to FIG. 5.

The interlayer insulating layer 160 is formed on the bus line 81, the first bus line connection member 31, and the first branch line connection member 32. The interlayer insulating layer 160 has an opening 661 that exposes an end of the first bus line connection member 31 and an end of the first branch line connection member 32, which are separated from each other by the gap with the width D1.

The branch line 82 is formed on the interlayer insulating layer 160. The branch line 82 is connected to the first branch line connection member 32 through the branch contact hole 651 formed at the interlayer insulating layer 160. The branch line 82 of the global control signal line, which may extend to the lower portion of the peripheral area P2, may be formed of and/or formed with the same material and/or same layer as the source electrode 176 and the drain electrode 177.

The main connection member 201 is formed on and directly contacts, one end of each of the first bus line connection member 31 and the first branch line connection member 32 exposed through the opening 661 of the interlayer insulating layer 160. The gap with the width D1 may be narrower than the opening 661 and may be positioned inside the opening 661. The main connection member 20 may be formed with or formed of the same material as the pixel electrode 710.

A method for manufacturing an organic light emitting diode (OLED) display is described with reference to FIG. 6 to FIG. 8.

In step S100, the assistance connection member set 301 is formed at the peripheral area P2.

In step S100, the assistance connection member set 301, which includes the first bus line connection member 31 and the first branch line connection member 32, is formed on the gate insulting layer 140, which overlaps the buffer layer 120 and/or the substrate 110. The assistance connection member set 301 is formed or and/or formed with the same material and/or same layer as the second storage electrode 127.

In step S200, the bus line 81 is formed on the gate insulating layer 140, a portion of the bus line 81 directly contacting the first bus line connection member 31. The bus line 81 is formed of and/or formed with the same material and/or same layer as the gate electrode 125. The interlayer insulating layer 160 for covering the assistance connection member 30 and the bus line 81 is then formed. Subsequently, a plurality of branch lines, which includes the branch line 82 and is separated from the bus line 81, is formed on the interlayer insulating layer 160. The branch line 82 is formed of and/or formed with the same material and/or same layer as the source electrode 176 and the drain electrode 177.

In step S300, an OS test is performed on the branch line 82. A probe pin is contacted with both ends of the branch line 82 (i.e., the tested branch line 82) to test whether any unintended short exists between the tested branch line 82 and an adjacent branch line 82 that immediately neighbors the tested branch line 82. The branch line 82 is separated from the bus line 81 by at least the gap with the width D, such that the resistance of the bus line 81 may not substantially affect the measured resistance. Therefore, a difference between the measured resistance and a predetermined resistance standard may be easily detected if an unintended short exists between the adjacent branch lines 82. Advantageously, the accuracy and/or efficiency of the OS test may be maximized.

In step S400, the main connection member 201 for connecting the bus line 81 and the branch line 82 to each other is formed. The main connection member 201 is formed on the first bus line connection member 31 and the first branch line connection member 32 to electrically connect the first bus line connection member 31 and the first branch line connection member 32, which are separated by the gap with the width D1. The main connection member 201 is simultaneously formed with the same material as the pixel electrode 710.

The main connection member 201 is not formed before performing the OS test, such that the bus line 81 and the branch line 82 of the global control signal line are separated during the OS test. The bus line 81 and the branch line 82 of the global control signal line are electrically connected by the main connection member 201 after the OS test has been performed. Advantageously, in the OS test, the difference between the measured resistance and the resistance standard may be easily detected if an unintended short exists between the adjacent branch lines.

While embodiments of the present invention have been described, it is to be understood that the invention is not limited to the disclosed embodiments. The invention is intended to cover various modifications and equivalent arrangements included within the spirit and scope of the appended claims.

What is claimed is:

1. A display device comprising:
    a display area for displaying an image;
    a peripheral area that surrounds the display area;
    a pixel disposed in the display area;
    a bus line disposed in the peripheral area and configured to transmit a signal;
    a connection conductor set electrically connected to the bus line; and
    a branch line electrically connected to the connection conductor set, configured to receive the signal from the bus line, and configured to transmit the signal to the pixel,
    wherein the connection conductor set includes the following separate elements:

an interconnection conductor;
a bus line connection conductor set, which directly contacts each of the interconnection conductor and the bus line;
a branch line connection conductor set, which is separated from the bus line connection conductor and directly contacts each of the interconnection conductor and the branch line, and
wherein a material of the interconnection conductor is different from a material of at least one of the bus line connection conductor set and the branch line connection conductor set,
wherein the interconnection conductor overlaps and directly contacts each of the bus line and the branch line,
wherein the display device further comprises:
a substrate;
a gate insulating layer disposed between the substrate and the branch line connection conductor set; and
an interlayer insulating layer disposed between the branch line connection conductor set and the branch line, and having an opening, and
wherein a portion of the interconnection conductor is disposed inside the opening and directly contacts the gate insulating layer, the bus line connection conductor set, and the branch line connection conductor set in the opening.

2. The display device of claim 1, wherein the signal is an initialization voltage or a control signal.

3. The display device of claim 1,
wherein a portion of the interconnection conductor directly contacts a first portion of the branch line connection conductor set in the opening, and
wherein a second portion of the branch line connection conductor set directly contacts the branch line.

4. The display device of claim 3,
wherein a material of the second portion of the branch line connection conductor set is different from a material of the first portion of the branch line connection conductor set.

5. The display device of claim 3,
wherein the interlayer insulating layer has a contact hole, and
wherein the branch line is connected to the branch line connection conductor set through the contact hole.

6. The display device of claim 1, further comprising:
a storage capacitor that includes a first storage electrode and a second storage electrode,
wherein the second storage electrode is disposed between the gate insulating layer and the interlayer insulating layer, and
wherein a material of at least one of the bus line connection conductor set and the branch line connection conductor set is same as a material of the second storage electrode.

7. The display device of claim 1, further comprising:
a transistor that includes a gate electrode, a source electrode, and a drain electrode; and
a pixel electrode disposed in the display area and electrically connected to one of the source electrode and the drain electrode,
wherein a material of the pixel electrode is same as the material of the interconnection conductor.

8. The display device of claim 7, wherein a material of at least one of the bus line and the branch line is same as a material of at least one of the source electrode and the drain electrode.

9. The display device of claim 8, wherein a material of the bus line is same as a material of the gate electrode.

10. The display device of claim 7, wherein a first material of at least one of the bus line connection conductor set and the branch line connection conductor set is same as a material of the gate electrode.

11. The display device of claim 10, further comprising a storage capacitor that includes a storage electrode, wherein a second material of the at least one of the bus line connection conductor set and the branch line connection conductor set is same as a material of the storage electrode.

12. The display device of claim 1,
wherein the bus line connection conductor set includes a first bus line connection conductor,
wherein the branch line connection conductor set includes a first branch line connection conductor,
wherein the first bus line connection conductor directly contacts the interconnection conductor, and
wherein the first branch line connection conductor is separated from the first bus line connection conductor, directly contacts the interconnection conductor, and is electrically connected to the first bus line connection conductor through the interconnection conductor.

13. The display device of claim 12,
wherein the bus line connection conductor set further includes a second bus line connection conductor,
wherein the branch line connection conductor set further includes a second branch line connection conductor,
wherein the second bus line connection conductor overlaps and directly contacts each of the bus line and the first bus line connection conductor, and
wherein the second branch line connection conductor overlaps and directly contacts each of the branch line and the first branch line connection conductor.

14. The display device of claim 13,
wherein the gate insulating layer is disposed between the substrate and the second bus line connection conductor; and
the interlayer insulating layer is disposed between the second bus line connection conductor and the bus line and having a contact hole, wherein the bus line contacts the second bus line connection conductor through the contact hole.

15. The display device of claim 12,
wherein the first bus line connection conductor overlaps and directly contacts the bus line, and
wherein the first branch line connection conductor overlaps and directly contacts the branch line.

* * * * *